United States Patent
Zundel et al.

(10) Patent No.: US 7,601,596 B2
(45) Date of Patent: Oct. 13, 2009

(54) SEMICONDUCTOR DEVICE WITH TRENCH TRANSISTORS AND METHOD FOR MANUFACTURING SUCH A DEVICE

(75) Inventors: Markus Zundel, Egmating (DE); Franz Hirler, Isen (DE); Rudolf Zelsacher, Klagenfurt (AT); Erwin Bacher, Villach (AT)

(73) Assignee: Infineon Technologies Austria AG, Villach (AT)

( * ) Notice: Subject to any disclaimer, the term of this patent is extended or adjusted under 35 U.S.C. 154(b) by 148 days.

(21) Appl. No.: 11/600,422

(22) Filed: Nov. 16, 2006

(65) Prior Publication Data

US 2008/0116511 A1 May 22, 2008

(51) Int. Cl.
*H01L 21/336* (2006.01)
(52) U.S. Cl. .................. 438/268; 438/134; 438/246; 438/267; 438/270; 438/275; 257/E21.651
(58) Field of Classification Search .................. None
See application file for complete search history.

(56) References Cited

U.S. PATENT DOCUMENTS

| 4,941,026 A | 7/1990 | Temple ............... 357/23.4 |
| 5,122,846 A * | 6/1992 | Haken ............... 257/66 |
| 5,468,982 A | 11/1995 | Hshieh et al. ............... 257/331 |
| 5,637,898 A | 6/1997 | Baliga ............... 257/330 |
| 5,986,304 A | 11/1999 | Hshieh et al. ............... 257/330 |
| 6,077,744 A * | 6/2000 | Hao et al. ............... 438/268 |
| 6,262,453 B1 * | 7/2001 | Hshieh ............... 257/341 |
| 6,262,470 B1 | 7/2001 | Lee et al. ............... 257/565 |
| 6,551,881 B1 * | 4/2003 | Letavic ............... 438/267 |
| 6,861,701 B2 | 3/2005 | Williams et al. ............... 257/329 |
| 6,885,062 B2 | 4/2005 | Zundel et al. ............... 257/335 |
| 7,005,351 B2 | 2/2006 | Henninger et al. ............... 438/268 |
| 2004/0031987 A1 * | 2/2004 | Henninger et al. ............... 257/328 |
| 2005/0017293 A1 | 1/2005 | Zundel et al. ............... 257/329 |

* cited by examiner

*Primary Examiner*—N Drew Richards
*Assistant Examiner*—Kyoung Lee
(74) *Attorney, Agent, or Firm*—Davidson, Davidson & Kappel, LLC (57) ABSTRACT

According to one embodiment, a method for manufacturing a semiconductor device includes forming trenches in a first side of a semiconductor material and forming a thick oxide layer on the trenches and on the first side. A part of the first side and the trenches is masked using a first mask, and the semiconductor material is doped by implantation through the thick oxide layer while the first mask is present. At least part of the thick oxide layer is removed while the first mask remains.

8 Claims, 12 Drawing Sheets

SEMICONDUCTOR DEVICE WITH TRENCH TRANSISTORS AND METHOD FOR MANUFACTURING SUCH A DEVICE

BACKGROUND OF THE INVENTION

The present invention relates to semiconductor devices with MOS transistors and methods of manufacturing such devices.

It is known to reduce the specific on resistance of MOS semiconductor devices by providing dense trenches packed together so that the avalanche breakdown region is located in a bottom region of the trench.

BRIEF DESCRIPTION OF THE DRAWINGS

The present invention will be further described with reference to several embodiments, in which:

FIG. 12 illustrates schematically the layout view at a top edge in FIG. 1 through a cross section in FIG. 1.

DETAILED DESCRIPTION OF THE INVENTION

According to one embodiment of the present invention, the present invention provides a method for manufacturing a semiconductor device comprising: forming trenches in a first side of a semiconductor material; forming a thick oxide layer on the trenches and on the first side; masking a part of the first side and the trenches using a first mask; doping the semiconductor material by implantation through the thick oxide layer while the first mask is present; and removing at least part of the thick oxide layer while the first mask remains.

Advantageously, the body structuring according to the implantation and the thick layer structuring thus align, and a separate masking for the body can be avoided.

According to a further embodiment, the present invention provides a method for manufacturing a semiconductor device comprising: forming trenches in a first side of a semiconductor material, the trenches having a bottom; forming a thick oxide layer on the first side of the semiconductor material and on the trenches; adding a conductive material in the trenches over the thick oxide layer; and doping the semiconductor material by implantation through the thick oxide layer, the trenches being covered by the thick oxide material and the conductive material so that the implantation avoids the trench bottom.

According to yet a further embodiment, the present invention provides a method for manufacturing a semiconductor device comprising forming trenches in a first side of a semiconductor material, the trenches having a bottom; forming a thick oxide layer on the first side of the semiconductor material and on the trenches; removing at least a part of the thick oxide layer; doping the semiconductor material by implantation to form a body region before or after the removing step; and thermally treating the semiconductor material after the doping to both form a thin oxide layer over the body and to extend the body region.

According to a device embodiment of the present invention, the present invention provides a semiconductor device comprising a base semiconductor material with a first side and a second side, the semiconductor material including a plurality of trenches, each trench extending perpendicularly with respect to the first and second sides and having a trench top at the first side and a trench bottom, each of the plurality of trenches having an end in an end direction, each end having a thick oxide layer at the trench top, and each trench having a thin oxide layer at the trench top away from the end beginning at a first location; and a plurality of body regions located in the base semiconductor material between the trenches, each body region including a body region end in the end direction; each body region end being a predetermined distance from the first location.

Figure 1:
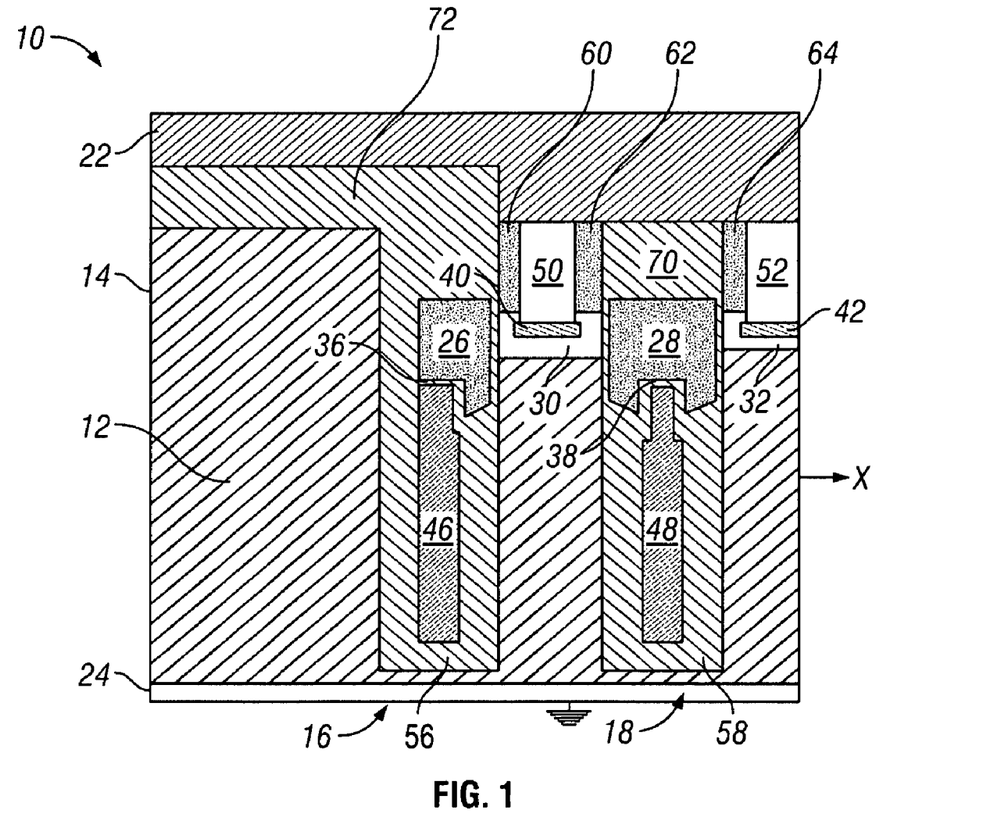
FIG. 1 illustrates schematically in a cross-view an edge region of a semiconductor device according to an embodiment of the present invention with vertical MOS power transistors with trenches.

FIG. 1 shows a semiconductor device 10 with vertical MOS power transistors, the semiconductor device 10 having a base region 12 made of a semiconductor material, for example an n-type silicon substrate. Device 10 has an edge 14 with an edge trench 16 and a plurality of other trenches 18 extending in the direction X of the semiconductor device. Several of such trenches may be provided in direction X.

Device 10 also has a top contact layer 22 and a bottom contact layer 24 functioning as the MOS transistor drain. The gate electrodes 26, 28 of the transistors are made from a highly-doped polysilicon material. These gate electrodes 26, 28 are separated by a thin oxide layer 36, 38 respectively with respect to field electrodes 46, 48. Field electrodes 46, 48 in turn are separated via thick oxide layers 56, 58, respectively, from the respective trench bottoms. Field electrodes 46, 48 reduce a capacitive coupling of the gate electrodes 26, 28 to the drain layer 24. Directly above drain layer 24, the base region 12 may include a doped n+ layer. Gate electrode 26 may be called an edge gate electrode since it is closest edge 14.

Boron-doped p regions 30, 32 form body contacts on the semiconductor base region 12 between the trenches 16, 18, etc., and provide the body region. Body contacts 30, 32 may include more highly boron-doped p+ region 40, 42, and are connected electrically to the top metal contact 22 via contact grooves 50, 52, made of a conductive material such as polysilicon or metal. N+ source terminals 60, 62, 64 are located aside the contact grooves 50, 52 and above the p regions 30, 32. Source terminals 62, 64 are separated by a dielectric region 70, and source terminal 60 is separated by a dielectric region 72 to the edge area.

Figure 2:
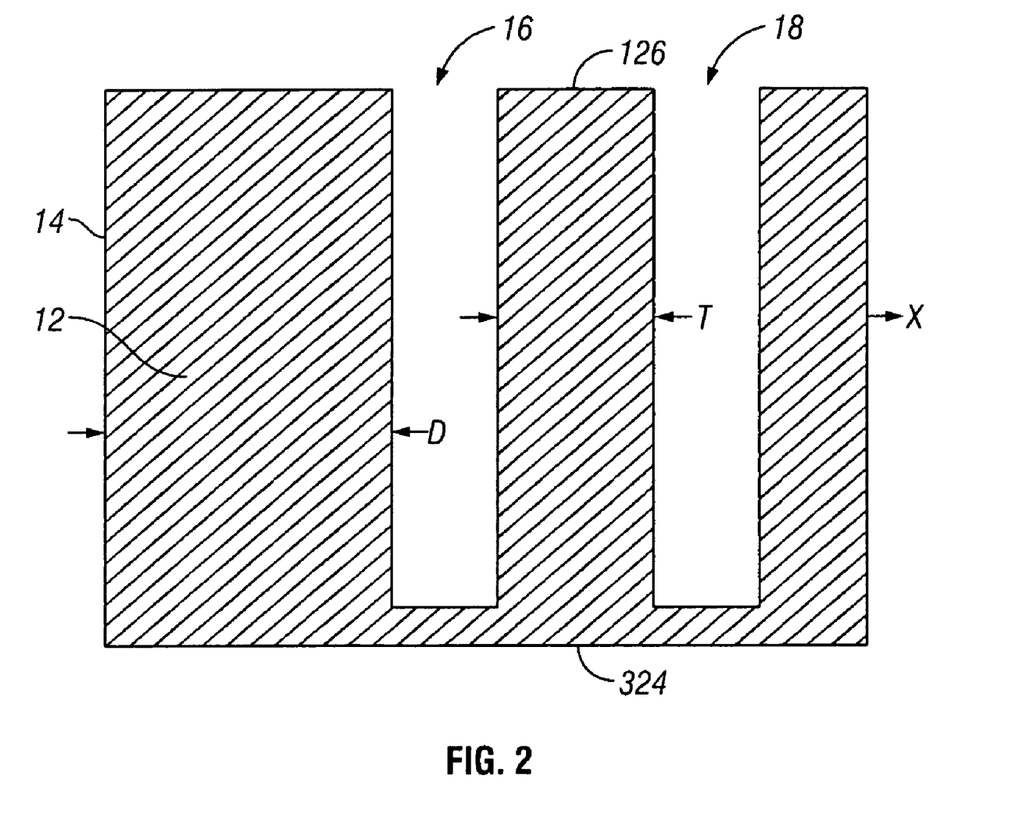
FIG. 2 shows the beginning semiconductor base material with trenches for the semiconductor device of FIG. 1.

FIG. 2 shows the beginning semiconductor base material 12 having a top side 126 and a bottom side 324, the semiconductor base material 12 being for example an n-type silicon material, with trenches 16, 18 cut into the top side 126 of base material 12. Several trenches generally are formed in the direction X, via for example etching. Between the first trench 16 and the edge 14, the distance D of semiconductor material preferably is more than the distance T between the trenches 16, 18.

Figure 3:
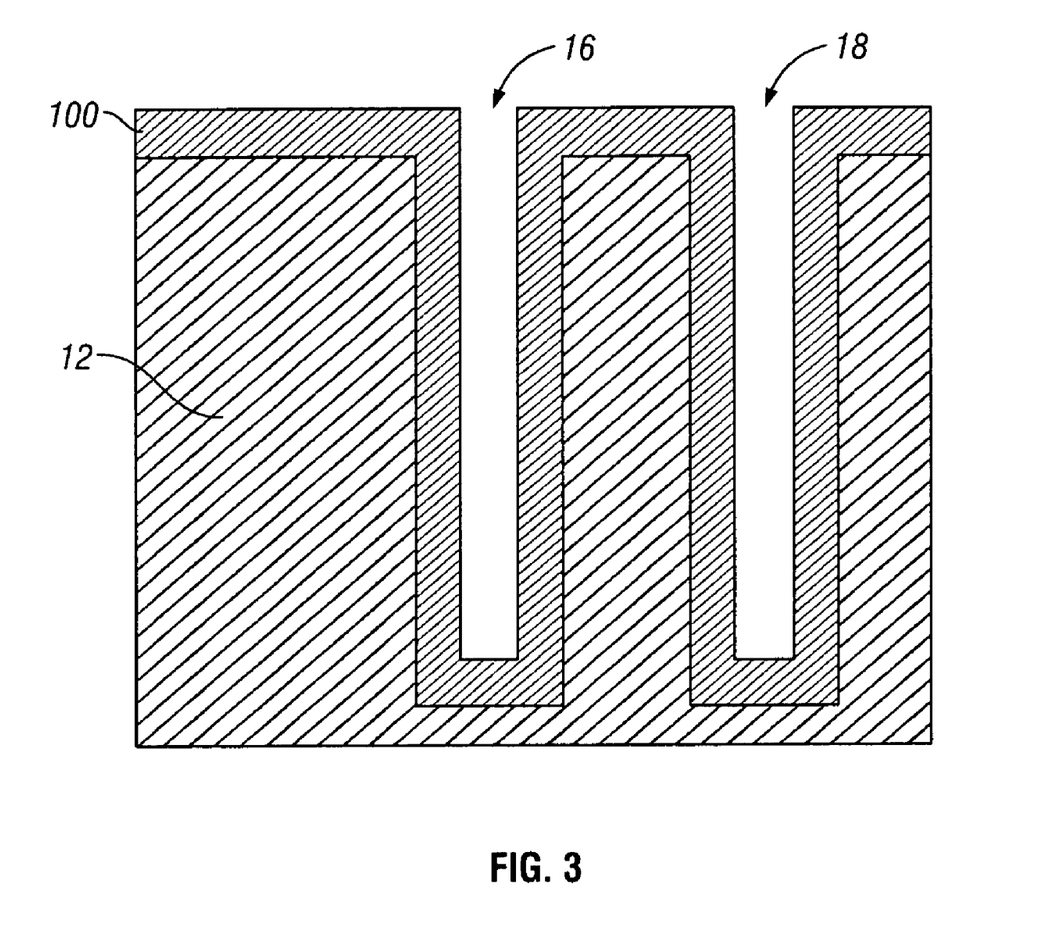
FIG. 3 shows a thick oxide layer over the base material shown in FIG. 2.

FIG. 3 shows a thick oxide (FOX) layer 100 which is deposited over the base material shown in FIG. 2, for example using a thermal oxidation at 1000 degrees Celsius or more for a desired time to create a thick oxide layer of a certain thickness, for example 300 nm.

Figure 4:
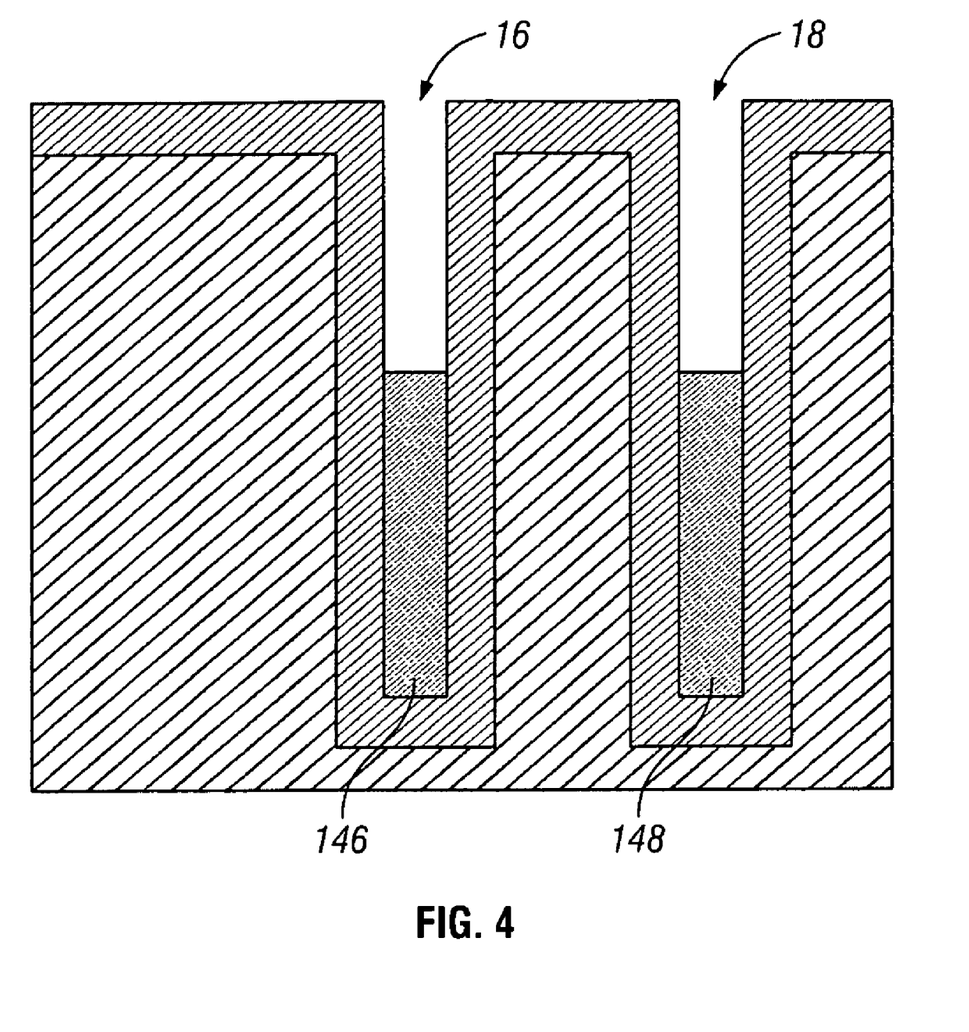
FIG. 4 shows polysilicon deposited in the trenches over the thick oxide layer.
Figure 5:
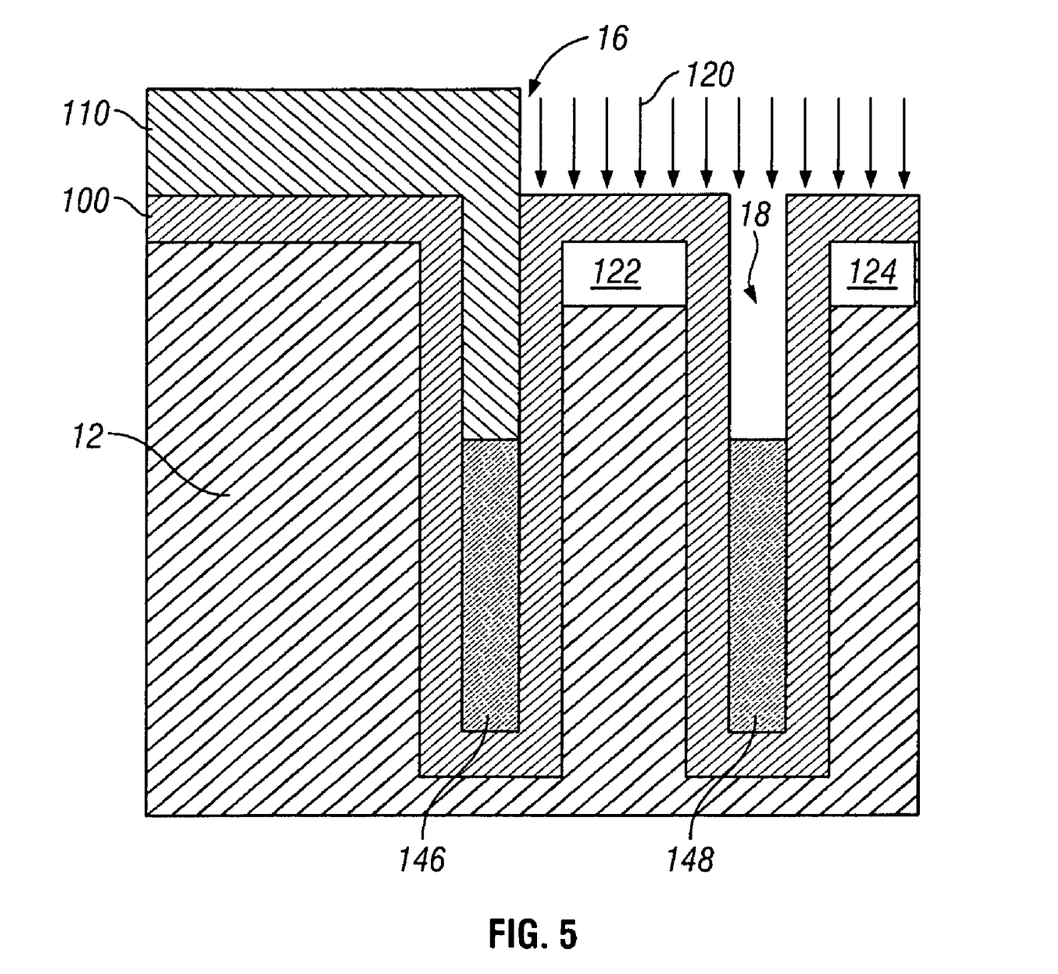
FIG. 5 shows a protective edge material and implantation of boron into the semiconductor base material through the thick oxide layer to form a body area.

As shown in FIG. 4, highly n-doped polysilicon areas 146, 148 can then be deposited and etched back in trenches 16, 18. This step is followed by placement of a protective layer or mask 110 over the edge region and the first trench 16, as shown in FIG. 5. A boron body implantation 120 then can occur, for example at 200 kEV or more, to begin to form p body regions 122, 124. The body implantation is highly energetic so as to penetrate the FOX layer 100. Any boron p doping on polysilicon area 148 has negligible effect, since the n dopant concentration of the polysilicon is so high, for example 1000 times higher, compared the resultant p boron dopant concentration on area 148.

Figure 6:
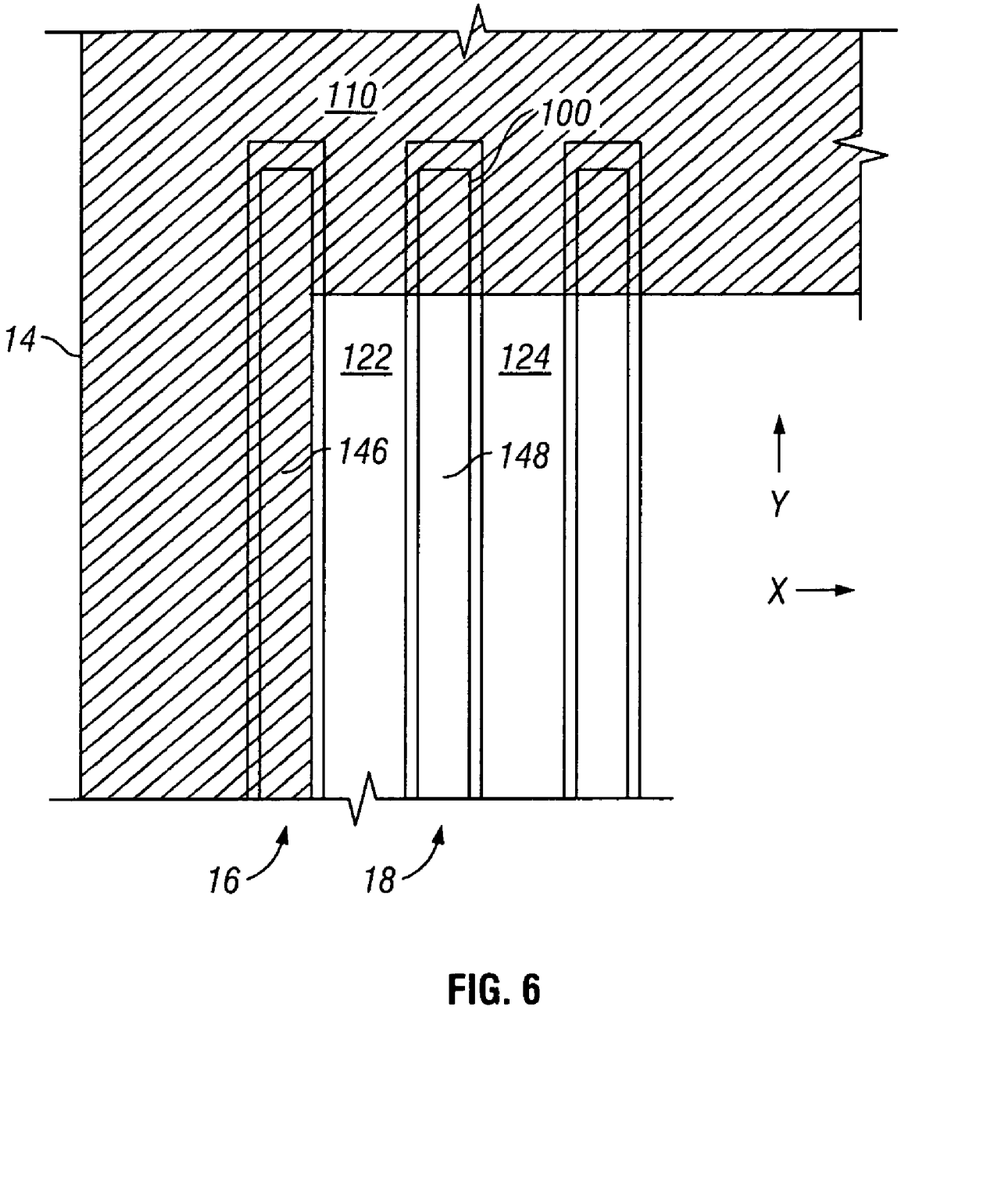
FIG. 6 illustrates schematically in layout view the mask at a top edge used for both the implantation 120 in FIG. 5 and for the FOX etching in FIG. 7.

As shown in FIG. 6, mask 110 also may cover an edge area at an end of the trenches 18 in the direction Y, so that the implantation does not occur at the end of the trenches. Mask 110 also can cover part of edge trench 16, including the polysilicon area 146, as shown.

Advantageously, the trench sidewall is covered with the FOX layer 100, and virtually no lateral straggling of the body implantation reaches the trench sidewall. The later channel region is not affected (See FIG. 1). The FOX layer thickness moreover, is sufficient, especially at higher voltage classes of greater than 30 volts for example, to exhibit a shielding effect with respect to any straggling. Moreover, since the trench bottom is covered by both the thick oxide 100 and the polysilicon material 146, 148, the implantation does not reach or affect the trench bottom.

Figure 7:
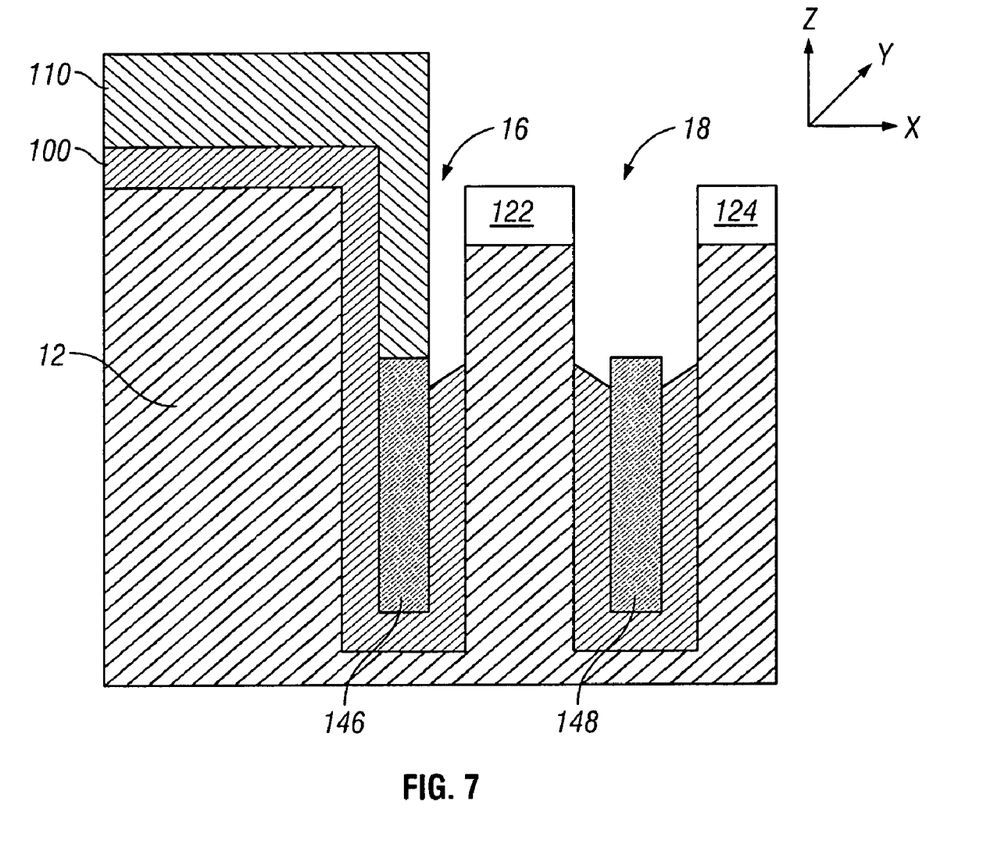
FIG. 7 illustrates partial removal of the thick oxide layer by etching.

As shown in FIG. 7, the FOX layer 100 then is etched away wherever the protective layer 110 is not located, and so that ends of the polysilicon areas 146, 148 in direction Z are partially exposed. The use of the boron implantation in FIG. 5 with the same protective layer 110 as the FOX layer etching is highly advantageous, as no separate masking for the implantation and FOX processes need be provided.

As can be seen from FIG. 6, the FOX layer 100 at the ends of the trenches in direction Y is not removed at the ends of the trenches since the mask 110 remains.

Figure 8:
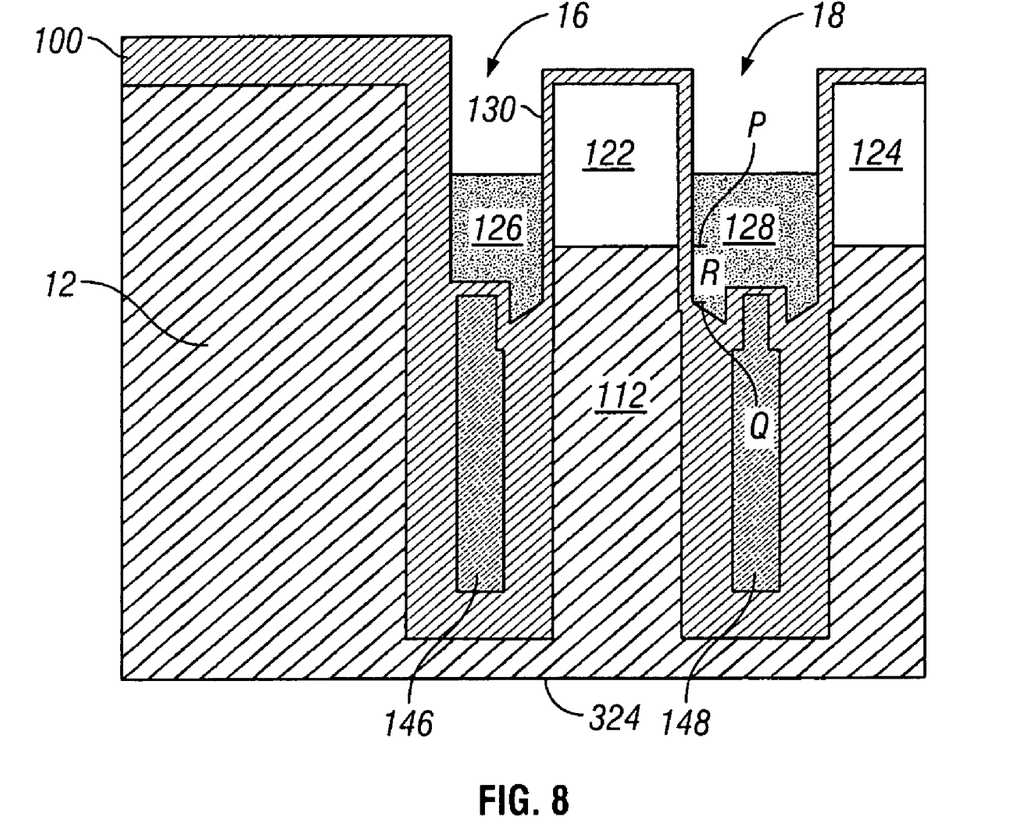
FIG. 8 illustrates removal of the protective layer, diffusion of the body area, a growth of a thin oxide layer, and addition of further polysilicon in the trenches.

As shown in FIG. 8, protective layer 110 is then removed and the body regions 122 and 124 are extended, i.e. grown, downwardly via a thermal treatment, for example at a temperature of 1000 Celcius at 200 minutes. After the body is fully formed, preferably a distance R remains between the FOX layer 100 and the bodies 122, 124. GOX layer 130 thus extends below body regions 122, 124. The GOX layer 130 thus preferably ends in the trench at a location Q below a location P where body 122 ends in the direction of side 124. The base material 12 here is thus defined as including both the bodies 122, 124 and the non-body semiconductor material regions. A further growth of the body regions so that end P extends past the location Q is also possible.

At the same time and due to the thermal treatment, a thin oxide (GOX) layer 130 is formed over the entire structure, and grows slightly into the semiconductor material regions. This layer may be for example 50 nm thick.

The gate electrode polysilicon material 126, 128 is then deposited over the thin oxide layer 130 in the trenches 16, 18.

Figure 9:
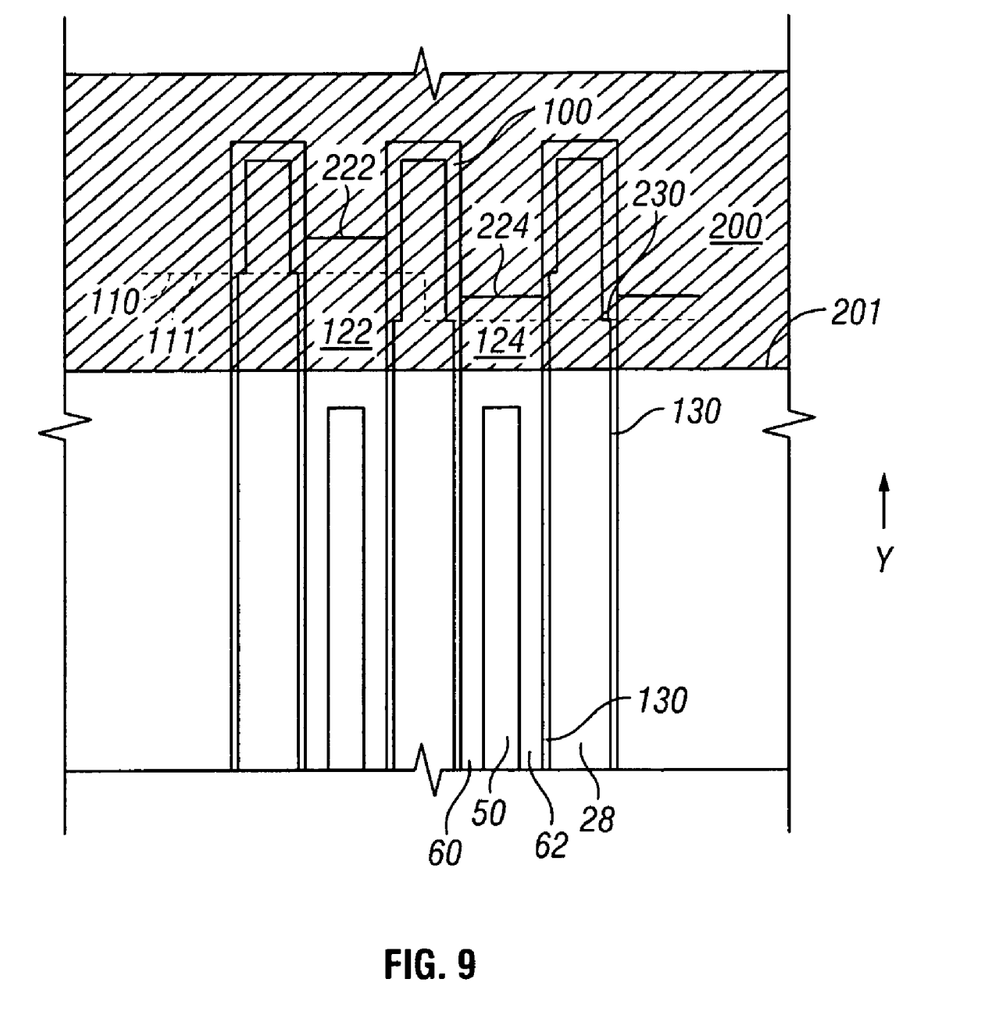
FIG. 9 illustrates schematically the layout view at a top edge in FIG. 1 through a cross section in FIG. 1.

FIG. 9 illustrates the advantageous self-adjustment of the body regions and the thick oxide at the end in direction Y. If the mask 110, for example, happens to have a crooked edge 111, the body ends 222, 224 after growth in direction Y are still adjacent the thick oxide FOX layer. The GOX region ends 230 defined by mask edge 111 thus is always inside, i.e. opposite direction Y, the body ends 222, 224, and the body regions always end in direction Y in the FOX regions. The GOX region ends 230 are also predetermined distance from the body ends, for example in the range of 10 nm to 2 microns or a maximal body region depth.

Figure 10:
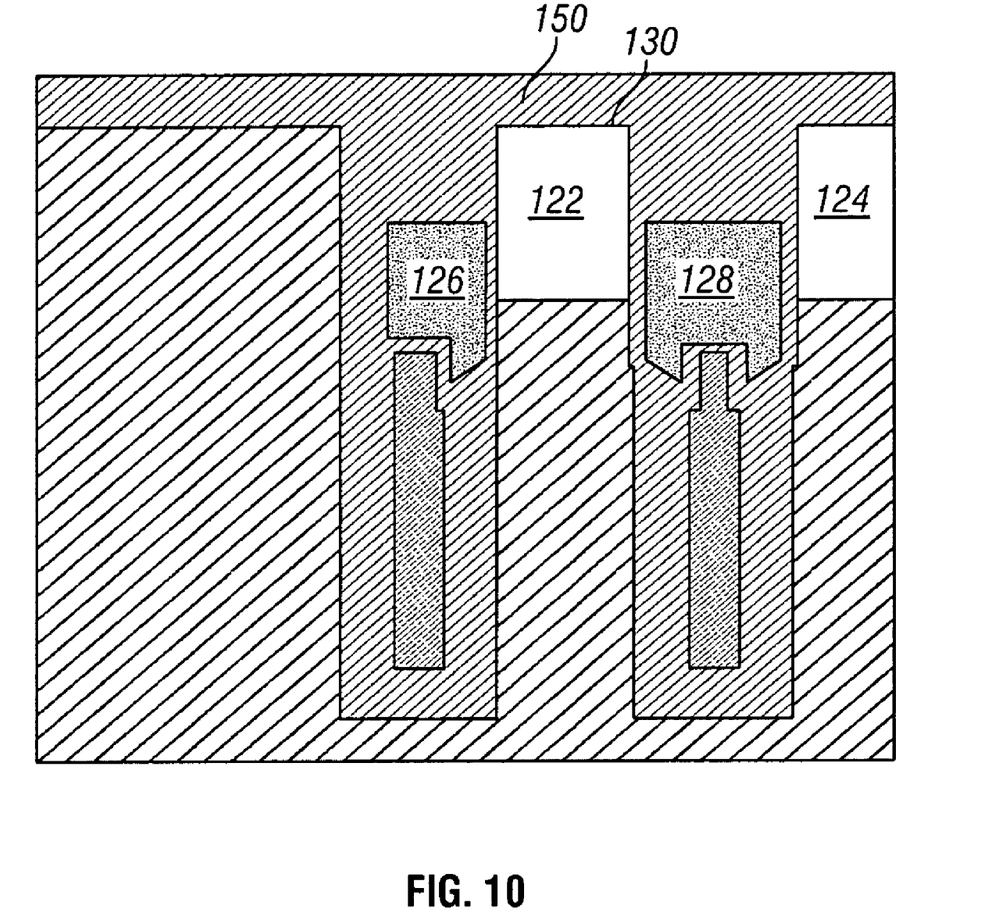
FIG. 10 shows addition of a further oxide to cover the trenches.

FIG. 10 shows addition of a further oxide 150 to cover the trenches, this oxide being deposited for example by CVD.

Figure 11:
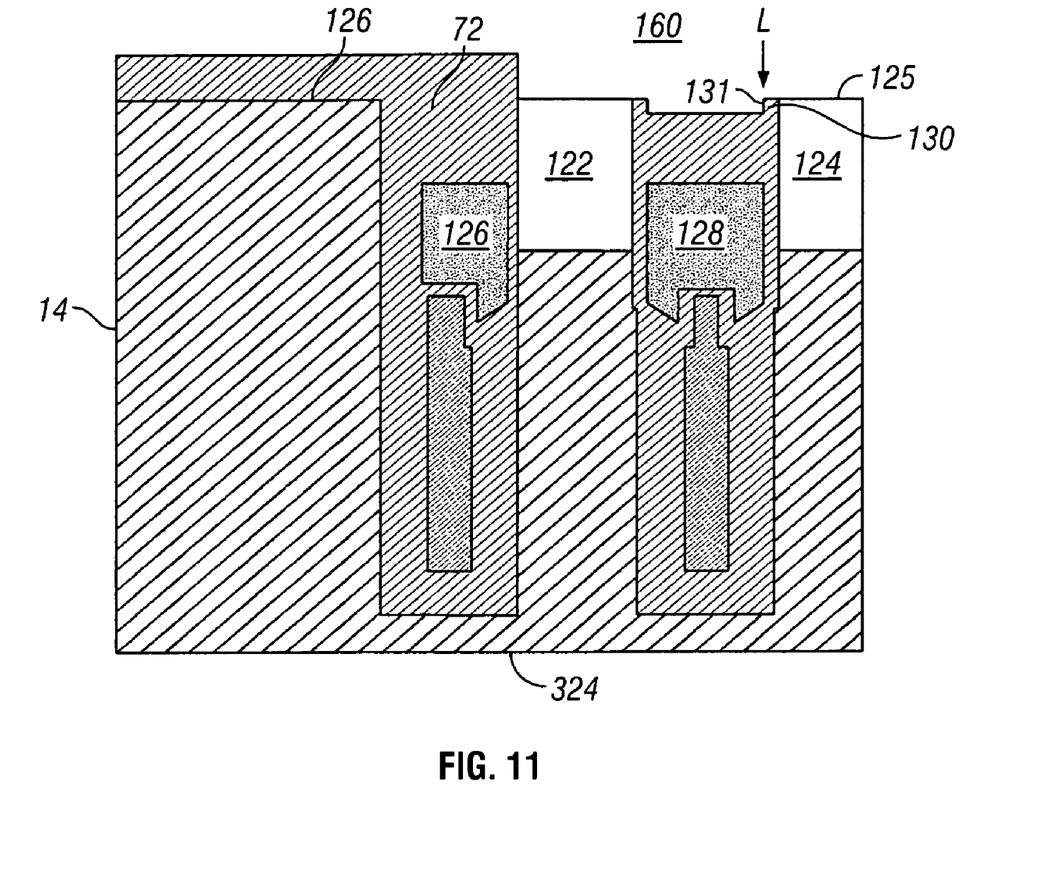
FIG. 11 shows an etching of the further oxide to provide access to the body areas.

FIG. 11 shows an etching at area 160 of the further oxide 150 to provide access to the body areas. A dielectric region 72 can be masked at the edge to remain unetched. A dielectric region 70 remains above the polysilicon material 126, 128.

Figure 12:
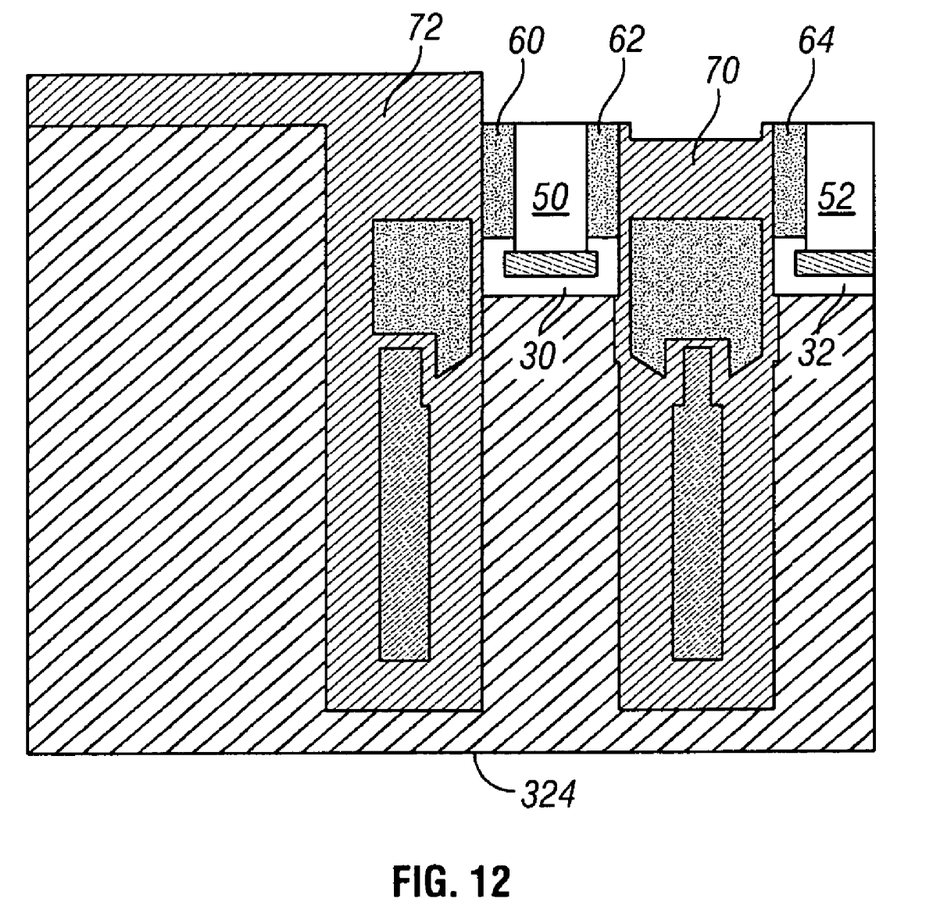
FIG. 12 shows the body areas formed with further structures before final deposition of the metal layer as shown in FIG. 1.

FIG. 12 shows the body areas 122, 124 of FIG. 11 formed before final deposition of the metal layer as shown in FIG. 1. The source regions 62, 64 are first implanted at the top section to form an n+ doped region, and then grooves for body contacts 30, 32 and contact grooves 50, 52 are etched away from the body area. As shown in FIG. 9, a second mask 200 with an edge 201 may be placed over the trench ends below the ends 222, 224 of the body regions 122, 124 during the formation of the n+ doped regions.

A further boron implantation occurs at the bottom of the etched areas and a rapid thermal annealing (RTA) process is carried out to form body contacts 30, 32. A metal or polysilicon material 50, 52 is deposited over body contacts 30, 32.

The semiconductor material side 124 away from the trench openings may be subjected to, for example, an n+ doping. Finally, metal contacts 22 and 24 as shown in FIG. 1 are added.

The semiconductor device 10 advantageously provides that existing thick oxide (FOX) and thin oxide (GOX) photo techniques with the body implantation. The temperature budget for the GOX process and additional temperature treatments can replace the body drive. Costs incurred by a separate photo technique (body structuring) and with the body drive are saved. In addition, the body and the thin gate oxide are self-adjusted with respect to each other, that is to say, due to the shielding effect of the body, no high drain potential is present at the thin gate oxide in an undesired manner. This translates into additional safety in terms of environmental-regulation issues. Moreover, by using a contact-trench photo technique (and/or an optional source photo technique), the source region end can be produced so as to be at a considerable distance from the body region end. This is very important in terms of breakdown voltage resistance and avalanche resistance.

Also, in the open design according to the invention, the body region is defined by the GOX/FOX masking technique; the subsequent temperature treatment ensures an overlap with the FOX region so that the thin oxide (GOX) regions are reliably protected by the body region. The GOX/FOX region is shifted inside a mesa and self-adjustment works immediately, so that the body region is shifted along correspondingly.

Highly dense DMOS power transistors having low on-resistance $R_{ON} \cdot A$ thus can be placed on the device at lower production costs.

Thin oxide layer as defined herein is merely one thinner than the thick oxide layer, which may be of any desired thickness.

As an alternative to the implantation with the FOX layer present, it may be possible to first etch away the FOX layer and then have a low energetic body implantation after the FOX etching, with an optional spacer technique to protect the trench sidewall during body implantation.

In the preceding specification, the invention has been described with reference to specific exemplary embodiments and examples thereof. It will, however, be evident that various modifications and changes may be made thereto without departing from the broader spirit and scope of the invention as set forth in the claims that follow.

What is claimed is:

1. A method for manufacturing a semiconductor device comprising:
    forming trenches in a first side of a semiconductor material;
    forming a thick oxide layer on the trenches and on the first side;
    masking a part of the first side and the trenches using a first mask and leaving another part of the first side and a part of at least one of the trenches unmasked;
    doping the semiconductor material by implantation through the thick oxide layer while the first mask is present; and
    removing at least part of the thick oxide layer while the first mask remains.

2. A method for manufacturing a semiconductor device comprising:
    forming trenches in a first side of a semiconductor material;
    forming a thick oxide layer on the trenches and on the first side;
    masking a part of the first side and the trenches using a first mask;
    doping the semiconductor material by implantation through the thick oxide layer while the first mask is present;
    removing at least part of the thick oxide layer while the first mask remains; and
    forming a thin oxide layer on the first side after the removing step.

3. The method as recited in claim 2 further comprising removing the first mask after the removing step and before the forming of the thin oxide layer step.

4. The method as recited in claim 2 wherein the forming of the thin oxide layer is a thermal treatment, the thermal treatment also expanding a section of the semiconductor material doped by the implantation.

5. A method for manufacturing a semiconductor device comprising:
    forming trenches in a first side of a semiconductor material;
    forming a thick oxide layer on the trenches and on the first side;
    masking a part of the first side and the trenches using a first mask;
    doping the semiconductor material by implantation through the thick oxide layer while the first mask is present; and
    removing at least part of the thick oxide layer while the first mask remains, the removing step including etching, a part of the thick oxide layer remaining underneath the first mask, the part of the thick oxide layer etched also being in the trenches.

6. A method for manufacturing a semiconductor device comprising:
    forming trenches in a first side of a semiconductor material;
    forming a thick oxide layer on the trenches and on the first side;
    masking a part of the first side and the trenches using a first mask;
    doping the semiconductor material by implantation through the thick oxide layer while the first mask is present;
    removing at least part of the thick oxide layer while the first mask remains; and
    adding a conductive material into the trenches after the forming of the thick oxide layer and prior to the doping step, the conductive material being distinct from the first mask.

7. The method as recited in claim 6 wherein the conductive material is doped polysilicon.

8. A method for manufacturing a semiconductor device comprising:
    forming trenches in a first side of a semiconductor material, the trenches having a bottom;
    forming a thick oxide layer on the first side of the semiconductor material and on the trenches;
    removing at least a part of the thick oxide layer from the first side of the semiconductor material and the trenches;
    doping the semiconductor material by implantation to form a body region before or after the removing step; and
    thermally treating the semiconductor material after the doping to both form a thin oxide layer over the body and in at least part of the trenches and to extend the body region.

* * * * *